United States Patent [19]
Hiteshew et al.

[11] Patent Number: 5,947,191
[45] Date of Patent: Sep. 7, 1999

[54] ELECTRONICS MODULE HEAT SINK WITH QUICK MOUNTING PINS

[75] Inventors: Timothy Paul Hiteshew; Anthony-Lau Huu Nguyen, both of Cary, N.C.; Chun-Seng Lin, Hsin-Chung, Taiwan

[73] Assignee: International Business Machines, Armonk, N.Y.

[21] Appl. No.: 08/852,771

[22] Filed: May 7, 1997

[51] Int. Cl.[6] .................................................. H05K 7/20
[52] U.S. Cl. ........................ 165/80.3; 165/185; 174/16.3; 257/719; 361/704; 411/549
[58] Field of Search .................. 165/80.3, 185; 174/16.3; 257/718, 719; 361/704, 707; 411/549

[56] References Cited

U.S. PATENT DOCUMENTS

| | | | |
|---|---|---|---|
| 2,100,816 | 11/1937 | Purinton | 411/549 |
| 2,555,291 | 5/1951 | Poupitch | 411/549 |
| 2,798,277 | 7/1957 | Flora | 411/549 |
| 3,220,077 | 11/1965 | Newcomer, Jr. et al. | 411/549 |
| 3,816,882 | 6/1974 | Maeda et al. | 411/549 |
| 5,208,731 | 5/1993 | Blomquist | 361/704 |
| 5,241,453 | 8/1993 | Bright et al. | 361/704 |
| 5,276,585 | 1/1994 | Smithers | 361/704 |
| 5,357,404 | 10/1994 | Bright et al. | 257/718 X |
| 5,506,752 | 4/1996 | Kong | 257/718 X |
| 5,589,711 | 12/1996 | Sano et al. | 257/718 |
| 5,603,374 | 2/1997 | Wu | 165/80.3 |
| 5,771,153 | 6/1998 | Sheng | 257/719 X |

*Primary Examiner*—Leonard Leo
*Attorney, Agent, or Firm*—George E. Grosser

[57] ABSTRACT

A heat sink for a computer chip is adapted for mounting to a heat exchange plate that has elongate slots with limited clearance on the other side. Mounting apparatus includes latch pins with an elongate knob at the end to have a T-shape with a reduced shaft to define a shank and collar that are so sized as to control the projection of the knob beyond the slot. Specially bent flexible members are preferably interposed between the collar and heat sink to force intimate engagement with the heat exchange plate.

3 Claims, 5 Drawing Sheets

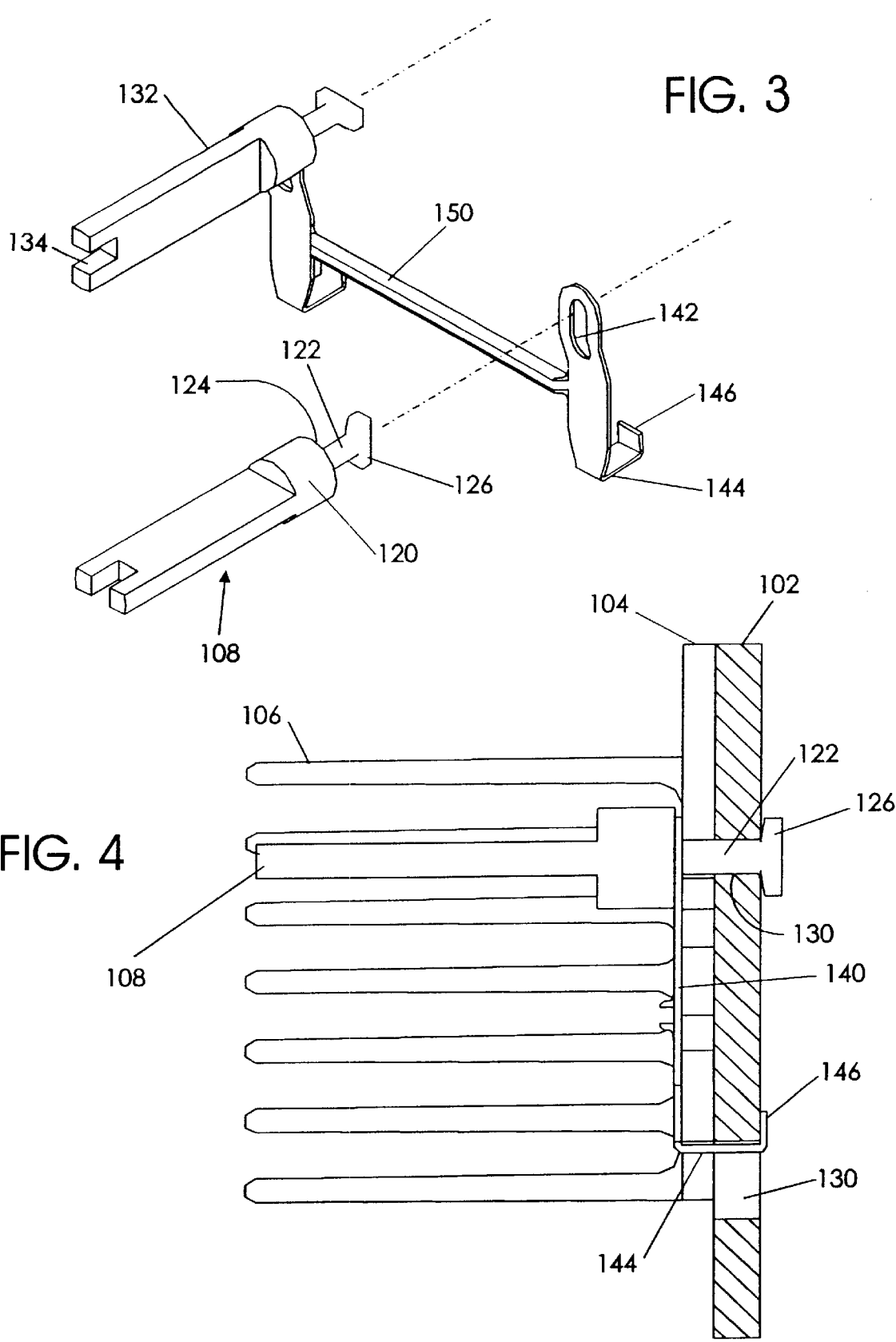

ELECTRONICS MODULE HEAT SINK WITH QUICK MOUNTING PINS

BACKGROUND OF THE INVENTION

Microprocessors used in computing equipment have been increasing in performance and operate at increasingly high clock speeds. As processor power has increased the need to dissipate heat has increased and it is now common for processors to be provided with large heat sinks. Usually heat sinks are bonded to the processor using an adhesive and the heat sink is disgarded if the processor fails. With the new line of processors from Intel Corporation which are sold under the name Pentium(™) II, the processor is included in a module that is of significantly larger size than the processor itself and the heat must be removed from a heat transfer surface of the module that part of a metal cover plate that is in contact with a face of the processor chip.

That plate has several small holes arranged for mounting of a heat sink using a plurality of screws. Also present are four elongate perforations in the plate which are generally symmetric about the long axis.

One problem with the use of screws to hold the heat sink is that it is a complex operation to perform on an assembly line to accurately place the heat sink and turn the multiple small screws into place. A second problem is that the heat sink extending from the module tends to block access within the computer and it is difficult to remove when so mounted. And, when removed, it is difficult to replace in the field and can cause problems as a result of shards of metal if one or more of the screws are slightly misaligned with the previously created threads when screwed back into the plate of the processor module.

SUMMARY OF THE INVENTION

Applicants have recognized that by arranging a heat sink having a contact plate against the heat transfer surface of the processor module while avoiding blocking the elongate slots in the module plate, it is possible to use a T-shaped latch member (or similar latch member with an asymmetric knob at the end) to enter the elongate slot and latch the surface by rotation therein. By using a wider shaft that is cut away to create a shank of selected length there is defined a collar which serves to control the penetration of the knob portion through the plate and avoid contact with electrical components in the module.

The collar further serves to urge the the heat sink plate against the plate of the module. It is preferred, however, to introduce a bent flexible member between the collar and the heat sink to provide a resilient urging of the heat sink toward the heat exchange surface of the module.

In a presently preferred implementation two flexible members are used which each have a hook on one end to catch on a slot of the module plate and extend over the heat sink to an opposite end which defines an aperature through which the knob of the latch member may be inserted in alignment with another of the slots of the module plate. This aperature is sized so that the collar does not pass through; but ,rather, presses against and deforms the flexible member when latch member is pressed and rotated to latch with the module plate. The deformation of the flexible member results in a firm pressure urging the heat sink plate into intimate engagement with the heat transfer surface of the module plate. To further enhance the heat transfer properties it is also preferred to put a thin sheet of compliant heat transfer tape between the plates.

BRIEF DESCRIPTION OF THE DRAWINGS

Presently preferred implementations for the invention are described below with reference to the drawings wherein:

FIG. 3 is an exploded view similar to FIG. 2, but of only the mounting apparatus;

FIG. 4 is a cutaway view from the right of a heat sink mounted according to the invention, taken vertically through a slot in the module plate;

DESCRIPTION OF THE PREFERRED EMBODIMENT

Figure 1:
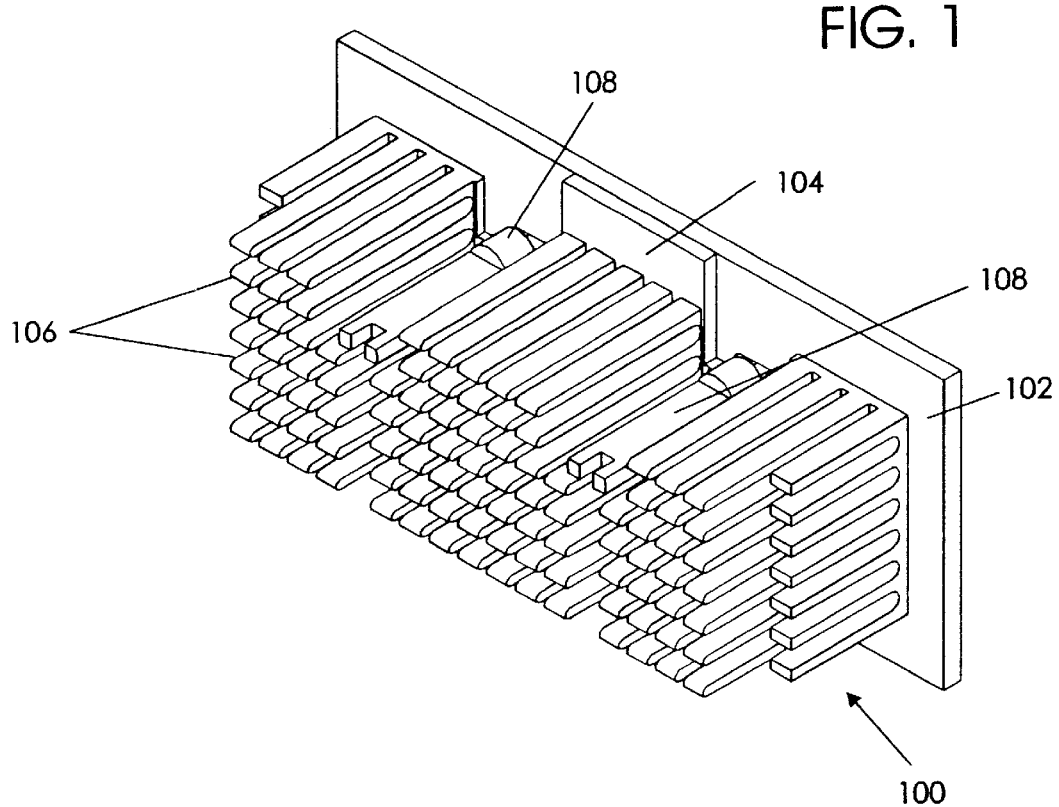
FIG. 1 is a front, right perspective view taken from above of a heat sink and mounting apparatus attached to a module plate.

Referring now to FIG. 1 there is shown a heat sink 100 mounted to a heat exchange plate 102 of an electronics module(not shown other than plate 102) in accordance with a preferred implementation of the invention. The heat sink 100 includes a contact plate 104 and fins 106 that serve to transfer heat into the surrounding air. As is well known the heat sink is preferably formed of a single piece of heat conducting metal such as aluminum. The heat sink 100 is mounted, according to the invention, using specially shaped pins 108 as will be described in more detail below.

Figure 2:
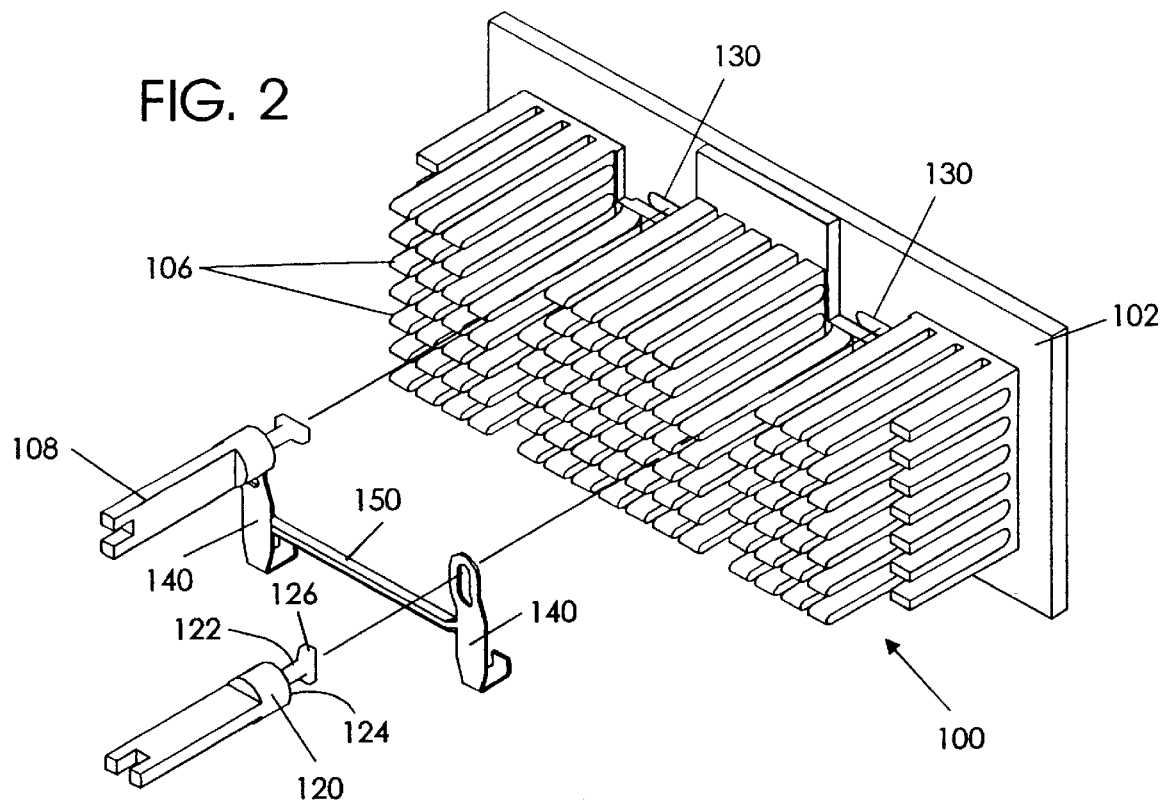
FIG. 2 is an exploded view similar to FIG. 1, but with the mounting apparatus separated from the heat sink.
Figure 5:
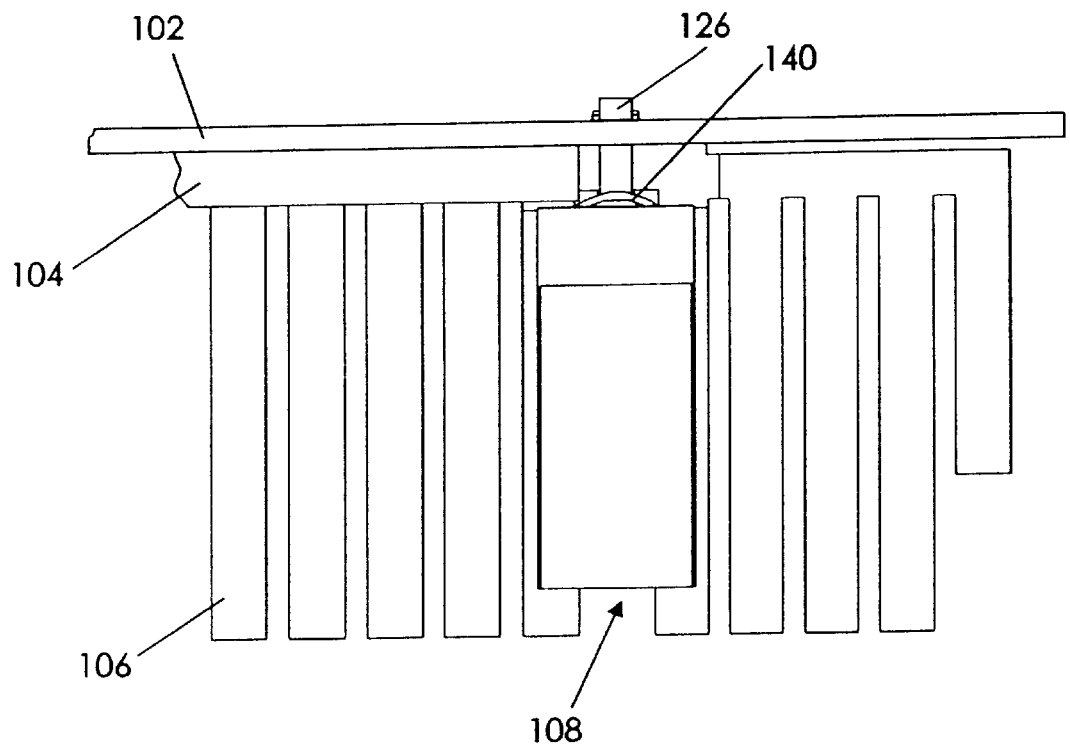
FIG. 5 is a top view of a heat sink according to the invention that is cut off on the left.

As can be seen in FIGS. 2 and 3, latch pins 108 have a shaft portion 120 which is cut away to provide a shank 122 and define a collar 124. At the end of the shank 122 there is formed a knob 126 which is elongate in one direction perpendicular to the shank 122 and, preferably, in conjunction with the shank, presents a T-shape. The dimensions of the knob 126 are selected to pass through an elongate slot(s) 130 defined in the plate 102 when the long dimension of the knob is aligned with the long dimension of the long dimension of the slot and to be blocked by the plate 102 when rotated out of such an alignment.

To permit firm latching, the length of the shank 122 is made slightly greater than the combined thickness of plates 102 and 104.

The pins 108 (see FIG. 3) at the end away from the knob 126 may be cut away to a blade shaped portion 132 to permit easy gripping for rotation and may be cut to define a notch 134 to allow easy rotation using a bladelike tool (not shown) such as a screwdriver.

Figure 6:
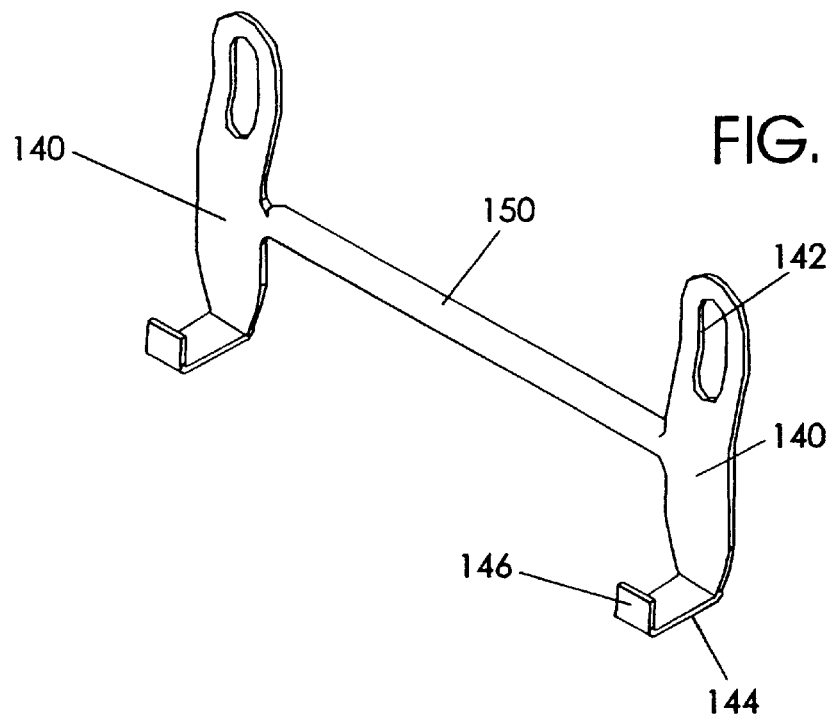
FIG. 6 is a left, rear perspective view from above of a pair of flexible members joined by an alignment strut as is preferred for implementing the invention.
Figure 7:
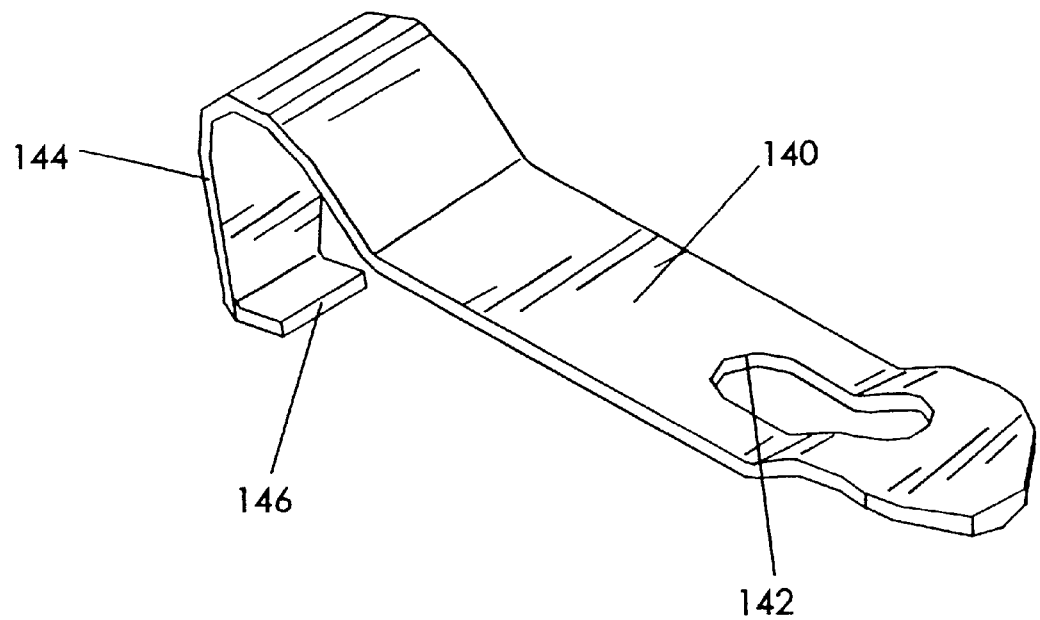
FIG. 7 is a right, front perspective view taken from above of a single flexible member according to a preferred implementation for the invention.
Figure 8:
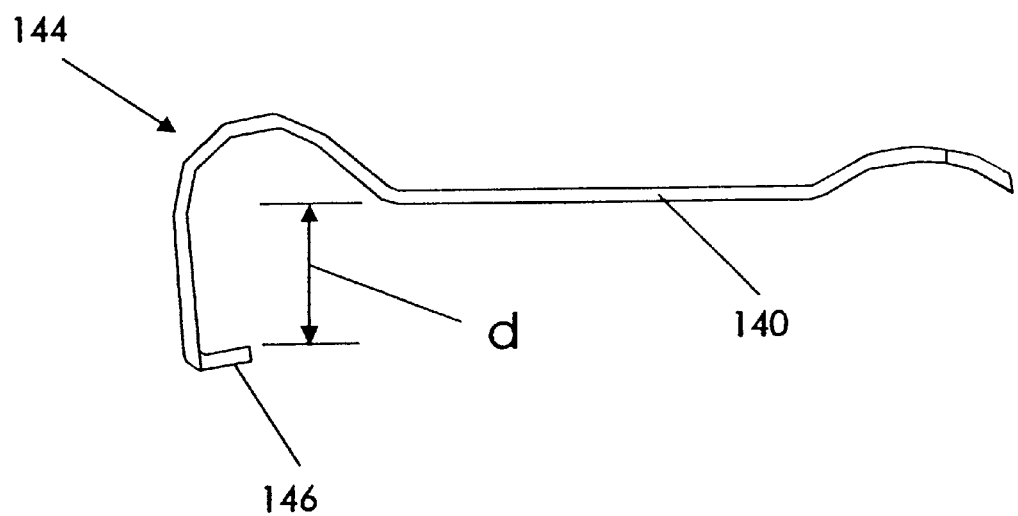
FIG. 8 is a right side plan view of a flexible member according to the invention.

For a presently preferred implementation of the invention which facilitates assembly, flexible clips 140 (see also FIGS. 6, 7 and 8) are also used and have defined at one end an elongate slot 142 of comparable dimension to the slot 130. At the end away from the slot 142 there is formed a hook 144 having a tab end 146. Referring to FIG. 8 the distance d is selected to be slightly less than the combined thickness of the plates 102 and 104. In use the hook 144 of clip 140 is inserted in a slot 130 (see FIG. 4) and is deformed to cause a force due to elasticity that urges the plates 102 and 104 into intimate contact to facilitate heat transfer. The distance between the hook 144 and the slot 142 is selected to correspond to the distance between the slots 130 of plate 102. The pin 108 is inserted through the slot 142 as well as a slot 130 of plate 102 and when rotated to a latching position (see FIG. 4) deforms the nonplanar portion of clip 140 surrounding the slot 142 (see also FIG. 8). Again the elastic force urges the plates 102 and 104 into intimate contact. To improve the heat exchange a thin layer of conforming heat transfer tape (not shown) may be placed between plates 102 and 104. When using the tape and clips the length of the shank 122 is extended to provide for their thickness.

Returning to FIGS. 2, 3 and 6, a preferred form of clip 140 is shown where a crossbar stabilizer 150 is used to connect two clips. With this arrangement, a pair of clips 140 may be more easily mounted to facilitate assembly. The stabilizer 150 allows two hooks 144 to be retained in the mounting position while a pin 108 is latched. With one pin 108 in place the assembly is stabilized and insertion and latching of a second pin 108 requires considerably less assembly line finesse than with plural separate clips.

Figure 9:
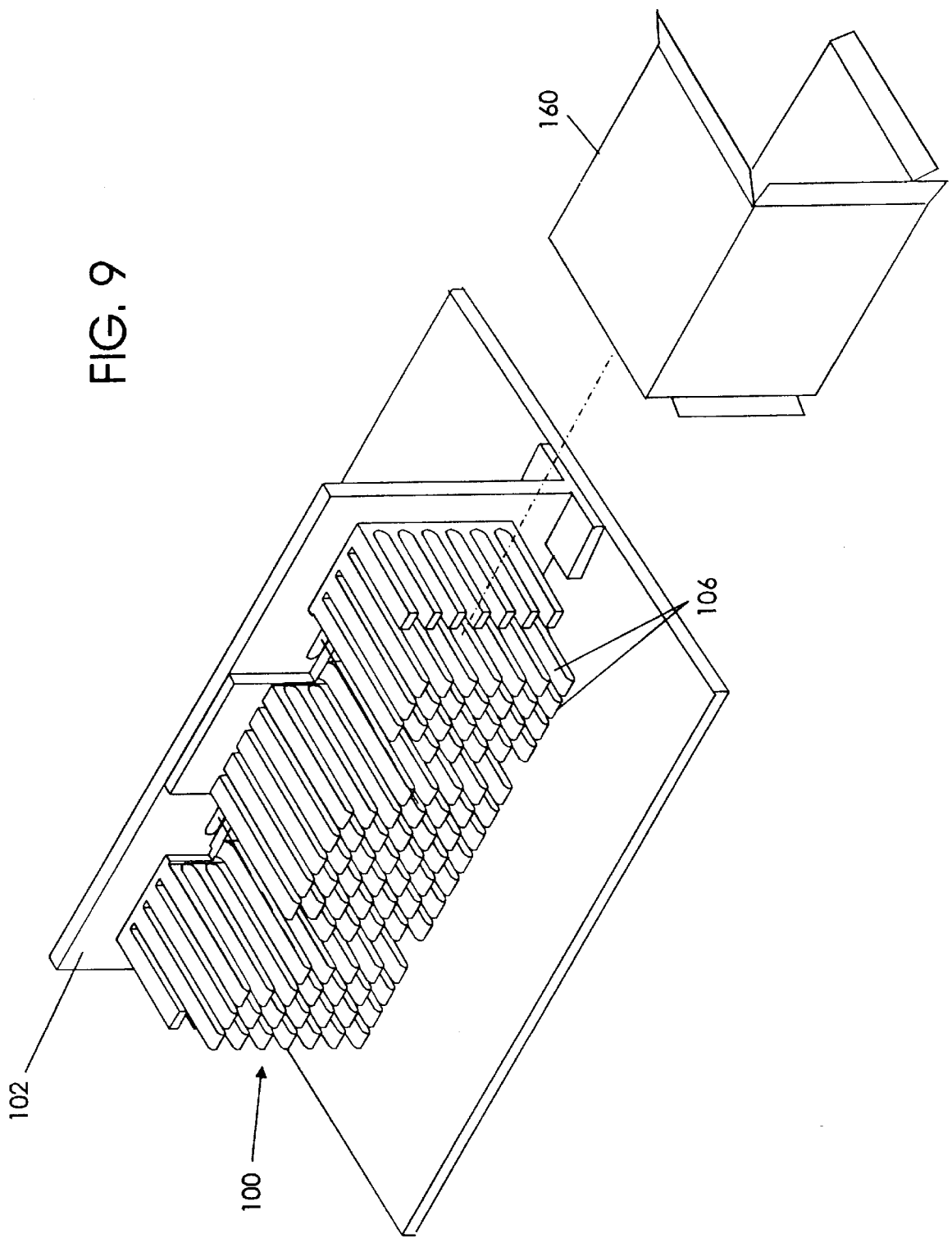
FIG. 9 is an exploded front, right perspective view for emphasizing a shroud preferably used for directing air through the heat sink.

Referring to FIG. 9 there is shown flex-fit metal shroud 160 that is sized to slip over the end of heat sink 100 and cooperates with a fan (not shown) to direct cooling air over fins 106. It is preferred to use the shroud to increase cooling effectiveness.

The invention has been described with particular reference to presently preferred implementation thereof but it should be appreciated that modifications and variations within the scope of the claimed invention may be suggested to those skilled in the art.

What is claimed is:

1. A heat sink apparatus for an electronic apparatus which has a heat exchange plate with multiple spaced elongate perforations defined therein and extending therethrough, said heat sink comprising:

a contact plate for abutting the heat exchange plate which contact plate is shaped to avoid covering at least two of said spaced perforations;

two pins having an elongate knob at one end that is configured to pass through said perforations when aligned herewith and to be blocked by the plate when rotated out of alignment with the slot;

one flexible member for each pin, the flexible member having a hook at one end and having a slot defined at the other end which is large enough to receive said knob, the hook and slot being spaced at a distance corresponding to the spacing of said perforations, the flexible members being connected rigidly by a crossbar extending therebetween;

the pin having a reduced diameter for a distance greater than the combined thickness of the heat exchange plate and contact plate so as to define a shank with a collar that is unable to fit through the slot of the flexible member, whereby each flexible member and pin cooperate to permit latching at a respective pair of spaced perforations to retain said contact plate against said heat exchange plate with the relative alignment of the flexible members being maintained by the crossbar to facilitate assembly.

2. A heat sink according to claim 1 wherein cooling fins are arranged on said contact plate.

3. A heat sink according to claim 1 wherein the flexible member is bent to elastically urge the contact plate against the heat exchange plate.

* * * * *